United States Patent
Hsu et al.

(10) Patent No.: US 8,704,277 B2
(45) Date of Patent: Apr. 22, 2014

(54) SPECTRALLY EFFICIENT PHOTODIODE FOR BACKSIDE ILLUMINATED SENSOR

(75) Inventors: Tzu-Hsuan Hsu, Kaohsiung (TW); Dun-Nian Yaung, Taipei (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 1158 days.

(21) Appl. No.: 11/624,568

(22) Filed: Jan. 18, 2007

(65) Prior Publication Data

US 2007/0262354 A1 Nov. 15, 2007

Related U.S. Application Data

(60) Provisional application No. 60/798,875, filed on May 9, 2006.

(51) Int. Cl.
*H01L 27/14* (2006.01)

(52) U.S. Cl.
USPC .......................................... 257/228; 257/292

(58) Field of Classification Search
USPC .................................................. 257/292, 228
See application file for complete search history.

(56) References Cited

U.S. PATENT DOCUMENTS

| | | | |
|---|---|---|---|
| 3,617,753 A | 11/1971 | Kato et al. | |
| 3,995,309 A | 11/1976 | Torreno, Jr. | |
| 4,001,878 A | 1/1977 | Weimer | |
| 4,154,632 A | 5/1979 | Mochizuki et al. | |
| 4,190,852 A | 2/1980 | Warner, Jr. | |
| 4,193,826 A | 3/1980 | Mochizuki et al. | |
| 4,199,386 A | 4/1980 | Rosnowski et al. | |
| 4,290,830 A | 9/1981 | Mochizuki et al. | |
| 4,481,522 A * | 11/1984 | Jastrzebski et al. | 257/229 |
| 4,507,674 A | 3/1985 | Gaalema | |
| 4,760,031 A | 7/1988 | Janesick | |
| 4,764,480 A | 8/1988 | Voca | |
| 5,005,063 A | 4/1991 | Janesick | |
| 5,244,817 A | 9/1993 | Hawkins et al. | |

(Continued)

FOREIGN PATENT DOCUMENTS

| | | |
|---|---|---|
| CN | 1763965 A | 4/2006 |
| CN | 1776917 | 5/2006 |

(Continued)

OTHER PUBLICATIONS

Williams, George M., "Back-Illuminated CCD Imagers for High Information Content Digital Photography", SPIE, vol. 3302, Apr. 1998, pp. 39-53.

(Continued)

*Primary Examiner* — Howard Weiss
*Assistant Examiner* — Tifney Skyles
(74) *Attorney, Agent, or Firm* — Haynes and Boone, LLP

(57) ABSTRACT

A backside illuminated sensor includes a semiconductor substrate having a front surface and a back surface and a plurality of pixels formed on the front surface of the semiconductor substrate. A dielectric layer is disposed above the front surface of the semiconductor substrate. The sensor further includes a plurality of array regions arranged according to the plurality of pixels. At least two of the array regions have a different radiation response characteristic from each other, such as the first array region having a greater junction depth than the second array region, or the first array region having a greater dopant concentration than the second array region.

20 Claims, 2 Drawing Sheets

(56) References Cited

U.S. PATENT DOCUMENTS

| | | |
|---|---|---|
| 5,473,181 A | 12/1995 | Schwalke et al. |
| 5,508,625 A | 4/1996 | Adams |
| 5,511,428 A | 4/1996 | Goldberg |
| 5,661,043 A | 8/1997 | Rissman et al. |
| 5,792,377 A | 8/1998 | Belcher et al. |
| 5,895,944 A | 4/1999 | Yamada |
| 5,900,623 A | 5/1999 | Tsang |
| 6,012,336 A | 1/2000 | Eaton et al. |
| 6,168,965 B1 | 1/2001 | Malinovich et al. |
| 6,169,319 B1 | 1/2001 | Malinovich et al. |
| 6,227,055 B1 | 5/2001 | Pitzer |
| 6,259,085 B1 | 7/2001 | Holland |
| 6,269,199 B1 | 7/2001 | Maloney |
| 6,331,873 B1 | 12/2001 | Burke et al. |
| 6,429,036 B1 | 8/2002 | Nixon et al. |
| 6,504,193 B1 | 1/2003 | Ishiwata et al. |
| 6,504,196 B1 | 1/2003 | Rhodes |
| 6,518,085 B1 | 2/2003 | Wang et al. |
| 6,552,712 B1 | 4/2003 | Koizumi |
| 6,635,912 B2 | 10/2003 | Ohkubo |
| 6,670,258 B2 | 12/2003 | Carlson et al. |
| 6,765,276 B2 | 7/2004 | Fasen et al. |
| 6,821,809 B2 | 11/2004 | Abe et al. |
| 6,849,469 B1 | 2/2005 | Thuruthiyil et al. |
| 6,884,651 B2 | 4/2005 | Toyoda et al. |
| 6,946,352 B2 | 9/2005 | Yaung |
| 7,005,637 B2 | 2/2006 | Costello et al. |
| 7,042,060 B2 | 5/2006 | Costello et al. |
| 7,074,639 B2 | 7/2006 | Burke et al. |
| 7,148,464 B2 | 12/2006 | Shibayama |
| 7,232,697 B2 | 6/2007 | Hsu et al. |
| 7,535,073 B2 | 5/2009 | Ezaki |
| 7,638,852 B2 | 12/2009 | Hsu et al. |
| 2001/0012225 A1 | 8/2001 | Rhodes |
| 2001/0017344 A1 | 8/2001 | Aebi |
| 2002/0011614 A1 | 1/2002 | Rhodes |
| 2002/0135034 A1 | 9/2002 | Shigenaka et al. |
| 2004/0149888 A1 | 8/2004 | Costello |
| 2004/0169625 A1 | 9/2004 | Park et al. |
| 2004/0178350 A1 | 9/2004 | Nagano et al. |
| 2004/0245642 A1 | 12/2004 | Hasunuma et al. |
| 2005/0090035 A1 | 4/2005 | Kim |
| 2005/0106872 A1* | 5/2005 | Hong et al. ............... 438/689 |
| 2005/0110050 A1 | 5/2005 | Walschap et al. |
| 2005/0167709 A1* | 8/2005 | Augusto ............... 257/292 |
| 2005/0179053 A1 | 8/2005 | Ezaki et al. |
| 2005/0184322 A1 | 8/2005 | Inoue |
| 2005/0205954 A1 | 9/2005 | King et al. |
| 2005/0233493 A1 | 10/2005 | Augusto |
| 2005/0255625 A1 | 11/2005 | Janesick et al. |
| 2005/0287479 A1 | 12/2005 | Moon |
| 2006/0043519 A1 | 3/2006 | Ezaki |
| 2006/0057759 A1 | 3/2006 | Zhang et al. |
| 2006/0084195 A1 | 4/2006 | Lyu |
| 2006/0086956 A1 | 4/2006 | Furukawa et al. |
| 2006/0121640 A1 | 6/2006 | Kim |
| 2006/0138498 A1 | 6/2006 | Kim |
| 2006/0197171 A1 | 9/2006 | Zhang et al. |
| 2006/0249803 A1 | 11/2006 | Yamamoto et al. |
| 2006/0267123 A1 | 11/2006 | Wu |
| 2006/0275945 A1 | 12/2006 | Yang et al. |
| 2006/0281215 A1 | 12/2006 | Maruyama et al. |
| 2007/0001100 A1 | 1/2007 | Hsu et al. |
| 2007/0008421 A1 | 1/2007 | Wu et al. |
| 2007/0023800 A1 | 2/2007 | Ohkawa |
| 2007/0052050 A1* | 3/2007 | Dierickx ............... 257/432 |
| 2007/0108476 A1 | 5/2007 | Hong |
| 2007/0117253 A1 | 5/2007 | Hsu et al. |
| 2007/0207566 A1 | 9/2007 | Fu et al. |
| 2008/0108167 A1 | 5/2008 | Abe et al. |
| 2008/0173963 A1 | 7/2008 | Hsu et al. |
| 2008/0265348 A1 | 10/2008 | Maas et al. |

FOREIGN PATENT DOCUMENTS

| | | |
|---|---|---|
| CN | 1877845 | 12/2006 |
| CN | 1905201 | 1/2007 |
| CN | 1229526 | 11/2009 |
| JP | 64082666 A | 3/1989 |
| JP | 07202161 A | 8/1995 |
| JP | 11008373 | 1/1999 |
| JP | 2002076312 | 3/2002 |
| JP | 2003152217 | 5/2003 |
| JP | 2003158291 | 5/2003 |
| JP | 2004233758 A | 8/2004 |
| JP | 2004241653 A | 8/2004 |
| JP | 2004-319610 | 11/2004 |
| JP | 2005150463 | 6/2005 |
| JP | 2005206432 | 8/2005 |
| KR | 10-2002-0005990 | 1/2002 |
| KR | 10-2005-103782 | 11/2005 |
| KR | 1020060010899 | 2/2006 |
| WO | 9859373 A1 | 12/1998 |

OTHER PUBLICATIONS

Korean Intellectual Property Office (KIPO), Notice of Preliminary Rejection mailed May 28, 2008, Korean Patent Application No. 10-2007-0045138, 8 pages.

Japanese Patent Office, Japanese Office Action mailed Jul. 17, 2009, 7 Pages, Application No. 2006-175291.

Chinese Patent Office, Office Action mailed Mar. 20, 2009; Application No. 2007101487965; 4 pages.

Chinese Patent Office, Office Action mailed Jul. 10, 2009; Application No. 2008100053075; 9 pages.

Chinese Patent Office, Office Action mailed May 8, 2009; Application No. 2007101011893; 6 pages.

Japanese Patent Office, Office Action mailed Feb. 15, 2010; Application No. 2006-175291, 4 pages (English translation 4 pages).

U.S. Patent and Trademark Office, Office Action mailed Dec. 9, 2009; Application No. 11/859,848, 20 pages.

U.S. Patent and Trademark Office, Office Action mailed Sep. 14, 2010, Application No. 12/537,167, 20 pages.

* cited by examiner

SPECTRALLY EFFICIENT PHOTODIODE FOR BACKSIDE ILLUMINATED SENSOR This application claims the benefit of U.S. Ser. No. 60/798,875 filed May 9, 2006, which is hereby incorporated by reference. This application is also related to U.S. Ser. No. 60/695,682 filed Jun. 30, 2005, which is hereby incorporated by reference.

BACKGROUND

An image sensor provides a grid of pixels, such as photosensitive diodes or photodiodes, reset transistors, source follower transistors, pinned layer photodiodes, and/or transfer transistors for recording an intensity or brightness of light on the diode. The pixel responds to the light by accumulating a charge—the more light, the higher the charge. The charge can then be used by another circuit so that a color and brightness can be used for a suitable application, such as a digital camera. Common types of pixel grids include a charge-coupled device (CCD) or complimentary metal oxide semiconductor (CMOS) image sensor.

Backside illuminated sensors are used for sensing a volume of exposed light projected towards the backside surface of a substrate. The pixels are located on a front side of the substrate, is thin enough so that light projected towards the backside of the substrate can reach the pixels. Back-side illuminated sensors provide a high fill factor and reduced destructive interference, as compared to front-side illuminated sensors.

A problem with back-side illuminated sensors is that different wavelengths of radiation to be sensed experience different effective absorption depths in the substrate. For example, blue light experiences a more shallow effective absorption depth, as compared to red light. Improvements in backside illuminated sensors and/or the corresponding substrate are desired to accommodate different wavelengths of light.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
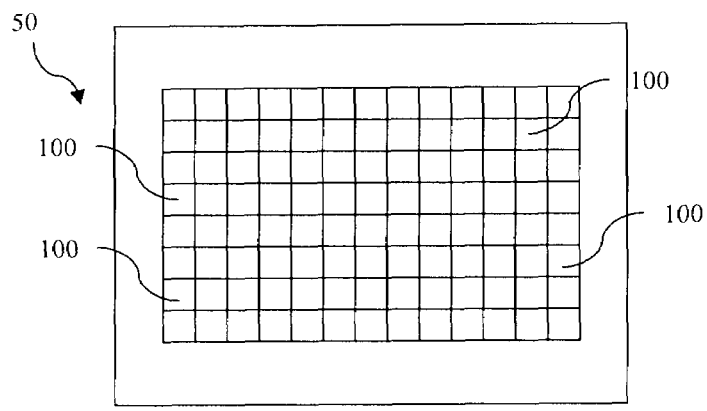
FIG. 1 is a top view of a sensor device including a plurality of pixels, according to one or more embodiments of the present invention.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, an image sensor 50 provides a grid of backside illuminated (or back-illuminated) pixels 100. In the present embodiment, the pixels 100 are photosensitive diodes or photodiodes, for recording an intensity or brightness of light on the diode. The pixels 100 may also include reset transistors, source follower transistors, pinned layer photodiodes, and transfer transistors. The image sensor 50 can be of various different types, including a charge-coupled device (CCD), a complimentary metal oxide semiconductor (CMOS) image sensor (CIS), an active-pixel sensor (ACP), or a passive-pixel sensor. Additional circuitry and input/outputs are typically provided adjacent to the grid of pixels 100 for providing an operation environment for the pixels and for supporting external communications with the pixels.

Figure 2:
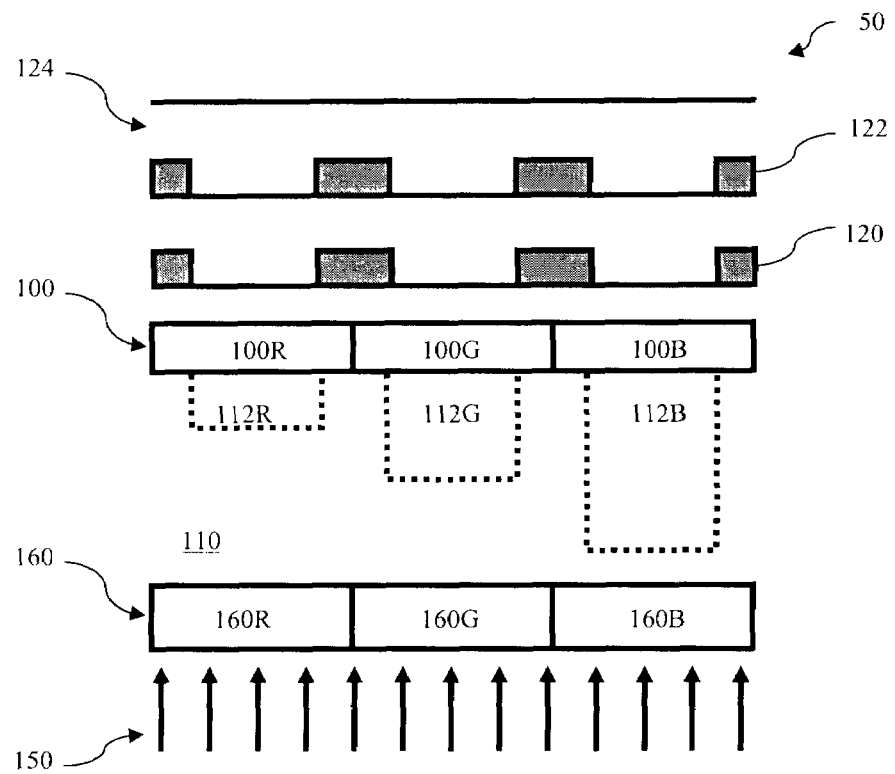
FIG. 2 is a sectional view of a sensor having a plurality of backside illuminated pixels, constructed according to aspects of the present disclosure.

Referring now to FIG. 2, the sensor 50 includes a silicon substrate 110. Alternatively, the substrate 110 may comprise an elementary semiconductor such as silicon, germanium, and diamond. The substrate 110 may also comprise a compound semiconductor such as silicon carbide, gallium arsenic, indium arsenide, and indium phosphide. Also, semiconductor arrangements such as silicon-on-insulator and/or an epitaxial layer can be provided. The substrate 110 may comprise an alloy semiconductor such as silicon germanium, silicon germanium carbide, gallium arsenic phosphide, and gallium indium phosphide. In the present embodiment, the substrate 110 comprises P-type silicon. All doping may be implemented using a process such as ion implantation or diffusion in various steps. The substrate 110 may comprise lateral isolation features to separate different devices formed on the substrate.

The sensor 50 includes a plurality of pixels 100 formed on the front surface of the semiconductor substrate 110. For the sake of example, the pixels are further labeled 100R, 100G, and 100B to correspond with example light wavelengths of red, green, and blue, respectively. The pixels 100 each comprise a light-sensing region (or photo-sensing region) which in the present embodiment is an N-type doped region 112 having dopants formed in the semiconductor substrate 110 by a method such as diffusion or ion implantation. In continuance of the present example, the doped regions are further labeled 112R, 112G, and 112B to correspond with the pixels 100R, 100G, and 100B, respectively. For the sake of further example, the light-sensing region 112 may have a doping concentration from about $10^{14}$ atoms/cm$^3$ to about $10^{21}$ atoms/cm$^3$. The depth relation of doped region is 112B>112G>112R. In one embodiment, the substrate 110 is 3.0 um, the distance between 112B and 160B is less than 1.5 um, the distance between 112G and 160G is less than 2.0 um, and the distance between 112R and 160R is less than 2.5 um. In some embodiments, the relation of distance between the color filter and doped region 112 can be selected to allow a desired amount of the light emitted through the color filter 160 to reach the doped region 112.

The sensor 50 further includes additional layers, including first and second metal layers 120, 122 and inter-level dielectric 124. The dielectric layer comprises a low-k material, as compared to a dielectric constant of silicon dioxide. Alternatively, the dielectric layer 124 may comprise carbon-doped silicon oxide, fluorine-doped silicon oxide, silicon oxide, silicon nitride, and/or organic low-k material. The material used in the metal layers 120 and 122 may include aluminum, copper, tungsten, titanium, titanium nitride, tantalum, tantalum nitride, metal silicide, or combinations thereof.

Additional circuitry also exists to provide an appropriate functionality to handle the type of pixels 100 being used and the type of light being sensed. It is understood that the wavelengths red, green, and blue are provided for the sake of example, and that the pixels 100 are generally illustrated as being photodiodes for the sake of example.

The sensor 50 is designed to receive light 150 directed towards the back surface of the semiconductor substrate 110 during applications, eliminating any obstructions to the optical paths by other objects such as gate features and metal lines, and maximizing the exposure of the light-sensing region to the illuminated light. The substrate 110 may be thinned such that the light 150 directed through the back surface thereof may effectively reach on the pixels 100. The illuminated light 150 may not be limited to visual light beam, but can be infrared (IR), ultraviolet (UV), and other proper radiation beam.

The sensor 50 further comprises a color filter layer. The color filter layer can support several different color filters (e.g., red, green, and blue), and may be positioned such that the incident light is directed thereon and there through. In one embodiment, such color-transparent layers may comprise a polymeric material (e.g., negative photoresist based on an acrylic polymer) or resin. The color filter layer may comprise negative photoresist based on an acrylic polymer including color pigments. In continuance of the present example, color filters 160R, 160G, and 160B correspond to pixels 100R, 100G, and 100B, respectively.

The sensor 50 may comprise a plurality of micro-lens interposed between the pixels 100 and the back surface of the semiconductor substrate 110, or between the color filters 160 and the back surface if the color filters are implemented, such that the backside-illuminated light can be focused on the light-sensing regions.

Figure 3:
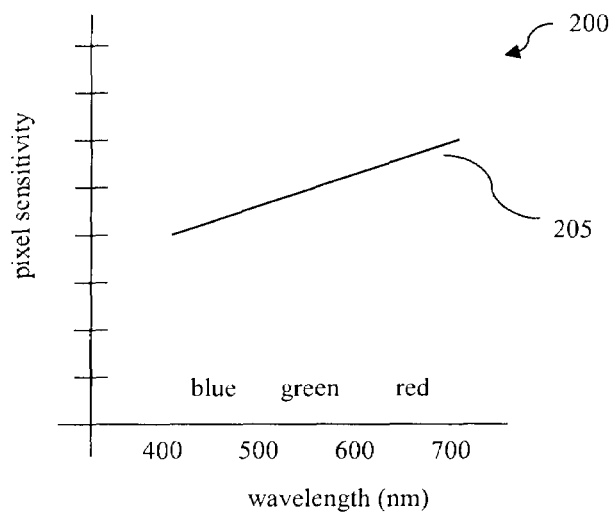
FIG. 3 is a graph of light sensitivity vs. wavelength for a sensor having array regions of relatively uniform size and/or dopant concentration.

Referring to FIG. 3, a graph 200 shows a comparison of the sensitivities for the various pixels 100R, 100G, and 100B, when responding to red, green, or blue light, respectively. The vertical axis of the graph 200 shows light or radiation sensitivity, and the horizontal axis shows light or radiation wavelength. As can be seen from the graph 200, if the regions 112 of the sensor 50 were commonly sized and/or doped in a conventional method, the light sensitivity 205 between the different pixels in response to red, green, and blue radiation wavelengths would be different. In the present example, the pixel for receiving blue light would have a reduced level of light sensitivity, as compared to the pixels for receiving green and red light.

Figure 4:
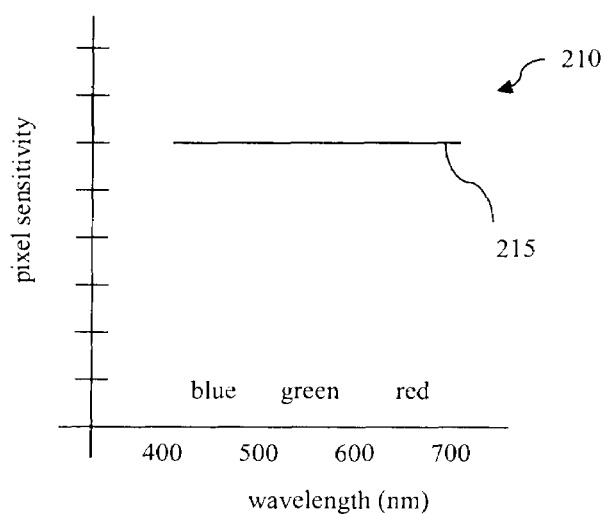
FIG. 4 is a graph of light sensitivity vs. wavelength for a sensor having array regions of varying size and/or dopant concentration

Referring now to FIG. 4, if the regions 112 of the sensor 50 have varying junction depths, dopant concentrations, and/or other characteristics, as discussed above with reference to FIGS. 1-2 according to one embodiment of this invention, then a more even distribution of light sensitivity 210 can be obtained between the different pixels in response to different wavelengths of radiation. In the present example, the wavelengths are red, green, and blue, and the pixels 100R, 100G, and 100B have corresponding color filters. It is understood that the variance of the regions 112 is dependent on various factors that are a choice of design (considering such things as material types, thicknesses, and so forth). For the sake of further example, the light-sensing region 112 may have a doping concentration from about $10^{14}$ atoms/cm$^3$ to about $10^{21}$ atoms/cm$^3$. In one embodiment, if the substrate 110 is 3.0 um, the distance between 112B and 160B is less than 1.5 um, the distance between 112G and 160G is less than 2.0 um, and the distance between 112R and 160R is less than 2.5 um.

Thus, provided is an improved sensor device and method for manufacturing same. In one embodiment, a backside illuminated sensor includes a semiconductor substrate having a front surface and a back surface and a plurality of pixels formed on the front surface of the semiconductor substrate. A dielectric layer is disposed above the front surface of the semiconductor substrate. The sensor further includes a plurality of array regions arranged according to the plurality of pixels. At least two of the array regions have a different radiation response characteristic from each other, such as the first array region having a greater junction depth than the second array region, or the first array region having a greater dopant concentration than the second array region.

In some embodiments, the plurality of pixels are of a type to form a CMOS image sensor. In other embodiments, the plurality of pixels are of a type to form a charge-coupled device. In other embodiments, the plurality of pixels are of a type to form an active-pixel sensor. In still other embodiments, the plurality of pixels are of a type to form a passive-pixel sensor.

In another embodiment, a method is provided for forming a backside illuminated sensor. The method includes providing a semiconductor substrate having a front surface and a back surface and forming first and second pixels on the front surface of the semiconductor substrate. A first doped region of the substrate is formed and aligned with the first pixel, and a second doped region of the substrate is formed and aligned with the second pixel. The first and second doped regions are formed to possess different radiation response characteristics from each other. In one embodiment, the first doped region has a greater junction depth than the second doped region. In another embodiment, the first doped region has a greater dopant concentration than the second doped region. Still other embodiments may exist with combinations of different junction depths and dopant concentrations.

In some embodiments, a third pixel is formed on the front surface of the semiconductor substrate and a third doped region of the substrate is formed and aligned with the third pixel. The first, second, and third doped regions are formed to possess a different radiation response characteristic from each other.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A backside illuminated sensor, comprising:
   a semiconductor substrate having a front surface and a back surface;
   a plurality of pixels formed on the front surface of the semiconductor substrate, wherein the plurality of pixels includes a first, second, and third pixel disposed at the front surface of the semiconductor substrate;
a dielectric layer disposed above the front surface of the semiconductor substrate;
a plurality of array regions arranged according to the plurality of pixels, wherein the plurality of array regions includes a first, second, and third array; and
a plurality of color filters formed over the back surface, each being aligned with one of the plurality of pixels, and
wherein the first array extends a first depth in a direction of the back surface, the second array extends a second depth in the direction of the back surface, the third array extends a third depth in the direction of the back surface, wherein the second depth extends deeper in the direction of the back surface of the substrate than first depth and the third depth extends deeper in the direction of the back surface than the second depth.

2. The sensor of claim 1, wherein the first array region has a greater dopant concentration than the second array region.

3. The sensor of claim 1, wherein the plurality of pixels are of a type to form a CMOS image sensor.

4. The sensor of claim 1, wherein the plurality of pixels are of a type to form a charge-coupled device.

5. The sensor of claim 1, wherein the plurality of pixels are of a type to form an active-pixel sensor.

6. The sensor of claim 1, wherein the plurality of pixels are of a type to form a passive-pixel sensor.

7. The sensor of claim 1, wherein the dielectric layer comprises a low-k material.

8. The sensor of claim 1, wherein the dielectric layer comprises silicon oxide.

9. The sensor of claim 8, wherein the silicon oxide is carbon-doped.

10. The sensor of claim 8, wherein the silicon oxide is fluorine-doped.

11. The sensor of claim 1 further comprising:
a plurality of metal layers over the substrate.

12. The sensor of claim 1, wherein the plurality of color filters includes:
a red color filter disposed over the back surface of the semiconductor substrate, the red color filter aligned with the first pixel;
a green color filter disposed over the back surface of the semiconductor substrate, the green color filter aligned with the second pixel; and
a blue color filter disposed over the back surface of the semiconductor substrate, the blue color filter aligned with the third pixel.

13. A backside illuminated sensor, comprising:
a first, second, and third pixel having a first, second, and third doping region, respectively;
a semiconductor substrate having a front side and a back side, the first, second, and third pixels formed at the front side of the semiconductor substrate;
a first, second, and third color filter formed over the back side of the semiconductor substrate, the first, second, and third color filter aligned with the first, second, and third pixel, respectively;
wherein the first doping region is spaced a first distance from the first color filter, the second doping region is spaced a second distance from the second color filter, the third doping region is spaced a third distance from the third color filter,
wherein the first doping region extends a first depth in a direction of the back side, the second doping region extends a second depth in the direction of the back side, the third doping region extends a third depth in the direction of the back side, and
wherein the second depth extends deeper in the direction of the back side of the substrate than first depth and the third depth extends deeper in the direction of the back side than the second depth.

14. The sensor of claim 13, wherein the first color filter is configured to filter a wavelength of red light, the second color filter is configured to filter a wavelength of green light, and the third color filter is configured to filter a wavelength of blue light.

15. The sensor of claim 13, wherein the first distance is greater than second distance and the second distance is greater than the third distance.

16. The sensor of claim 13, wherein the first, second, and third doping regions have a doping concentration from approximately $10^{14}$ atoms/cm$^3$ to approximately $10^{21}$ atoms/cm$^3$.

17. The sensor of claim 13, wherein the first, second, and third distances enable the first, second, and third doping regions to be configured so that a uniform spectral response is achieved by the first, second, and third pixels.

18. A backside illuminated sensor, comprising:
a semiconductor substrate having a front surface and a back surface;
a first, second, and third pixel disposed at the front surface of the semiconductor substrate, the first, second, and third pixel having a first, second, and third doping region, respectively;
a red color filter disposed over the back surface of the semiconductor substrate, the red color filter aligned with the first pixel;
a green color filter disposed over the back surface of the semiconductor substrate, the green color filter aligned with the second pixel; and
a blue color filter disposed over the back surface of the semiconductor substrate, the blue color filter aligned with the third pixel;
wherein the first doping region extends a first depth in a direction of the back surface, the second doping extends a second depth in the direction of the back surface, the third doping region extends a third depth in the direction of the back surface,
wherein the second depth extends deeper in the direction of the back surface of the substrate than first depth and the third depth extends deeper in the direction of the back surface than the second depth.

19. The sensor of claim 18, wherein the first depth is less than 0.5 µm, the second depth is less than 1.0 µm, and the third depth is less than 1.5 µm.

20. The sensor of claim 18, wherein the first, second, and third doping regions are formed to possess a different doping concentration from each other.

* * * * *